United States Patent
Shen et al.

(10) Patent No.: US 7,512,856 B2
(45) Date of Patent: Mar. 31, 2009

(54) REGISTER CIRCUIT, SCANNING REGISTER CIRCUIT UTILIZING REGISTER CIRCUITS AND SCANNING METHOD THEREOF

(75) Inventors: Tzu-Pin Shen, Hsin-Chu (TW); Shang-Chih Hsieh, Kao-Hsiung Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 344 days.

(21) Appl. No.: 11/562,424

(22) Filed: Nov. 22, 2006

(65) Prior Publication Data

US 2008/0116929 A1    May 22, 2008

(51) Int. Cl.
*G01R 31/28* (2006.01)
(52) U.S. Cl. ...................... 714/731; 714/727
(58) Field of Classification Search ................. 713/500; 714/726, 724, 733, 729, 731, 727
See application file for complete search history.

(56) References Cited

U.S. PATENT DOCUMENTS

| | | | |
|---|---|---|---|
| 5,109,190 A * | 4/1992 | Sakashita et al. ............ 714/727 |
| 5,784,384 A * | 7/1998 | Maeno ........................ 714/726 |
| 6,108,805 A | 8/2000 | Rajsuman |
| 6,378,091 B1 * | 4/2002 | Hashimoto ................... 714/724 |
| 6,539,491 B1 * | 3/2003 | Skergan et al. .............. 713/500 |
| 6,670,944 B1 | 12/2003 | Ishii |
| 7,032,149 B2 * | 4/2006 | Reynolds, Jr. ............... 714/733 |
| 7,358,786 B2 | 4/2008 | Kim |
| 7,444,569 B2 * | 10/2008 | Shidei ........................ 714/729 |
| 2005/0289422 A1 | 12/2005 | Lin et al. |

FOREIGN PATENT DOCUMENTS

| | | |
|---|---|---|
| TW | I233125 | 5/2005 |
| TW | 200537806 | 11/2005 |

* cited by examiner

*Primary Examiner*—David Ton
(74) *Attorney, Agent, or Firm*—Winston Hsu

(57) ABSTRACT

The present invention discloses a register circuit. The register circuit includes a latch circuit for latching an input data to generate an output data; an input signal selecting circuit, coupled to a non-test data and a test data respectively, for selectively outputting the non-test data or the test data as the input data; a control circuit, coupled to a driving clock, for controlling the latch circuit to latch the input data as the output data according to the driving clock; and a scanning circuit, coupled to the driving clock and the latch circuit, for scanning the output data of the latch circuit to generate a scanning data according to the driving clock.

14 Claims, 4 Drawing Sheets

REGISTER CIRCUIT, SCANNING REGISTER CIRCUIT UTILIZING REGISTER CIRCUITS AND SCANNING METHOD THEREOF

BACKGROUND OF THE INVENTION

1. Field of the Invention

The present invention discloses a circuit testing device and testing method thereof, and more particularly a register circuit utilized in a Domino CMOS logic circuit, a scanning register circuit that utilizes the register circuit and a method thereof.

2. Description of the Prior Art

In the field of digital logic circuits, circuit designers replace static circuits with dynamic circuits in order to increase the operating frequency of the circuit, wherein the dynamic circuit includes a domino CMOS logic circuit, a differential cascade voltage swing logic, etc. The domino CMOS logic circuit will herein be taken as an example. The domino CMOS logic circuit comprises a pseudo NMOS configuration to implement the domino CMOS logic circuit. Therefore, compared to the static circuit, using a pseudo NMOS configuration in the domino CMOS logic circuit will greatly reduce the number of transistors. Furthermore, the domino CMOS logic circuit has much less pull-up delay and a negligible short-circuit current effect when undergoing a dynamic operation. Therefore, using the domino CMOS logic circuit to implement a dynamic circuit is a more compatible method when designing an integrated circuit.

In reality, however, the above-mentioned domino CMOS logic circuit has a major problem when testing the dynamic circuit. In the prior art, the testing method can only test the dynamic circuit under the assumption that the domino CMOS logic circuit is comprised of purely combinational Domino gates, and the testing method is not appropriate for sequential Domino logic. Thus, most circuit designers nowadays prefer to use a combination of the dynamic circuit and the static circuit.

According to U.S. Pat. No. 6,108,805 "DOMINO SCAN ARCHITECTURE AND DOMINO SCAN FLIP-FLOP FOR THE TESTING OF DOMINO AND HYBRID CMOS CIRCUTS", such a system has at least three disadvantages. Firstly, because the output stage of the prior art domino CMOS logic circuit is comprised of multiple stages, the time required for generating an output data from an input data is longer. Secondly, because the prior art utilizes two control clocks, a system clock and a Domino clock in the operating procedure, the timing between the system clock and the Domino clock has to be precisely controlled to obtain the output data. Thirdly, the duty cycle of the system clock and Domino clock utilized by the prior art are different, which will complicate the implementation of the circuit.

SUMMARY OF THE INVENTION

Therefore, an objective of the present invention is to provide a register circuit, a scanning register circuit that utilizes the register circuit, and a method thereof, to solve the above-mentioned problem.

According to an embodiment of the present invention, a register circuit is disclosed. The register circuit comprises a latch circuit, an input signal selecting circuit, a control circuit, and a scanning circuit. The latch circuit is utilized for latching an input data to generate an output data; the input signal selecting circuit is coupled to a non-test data and a test data respectively, for selectively outputting the non-test data or the test data as the input data; the control circuit is coupled to a driving clock, for controlling the latch circuit to selectively latch the input data for determining the output data according to the driving clock; and the scanning circuit is coupled to the driving clock and the latch circuit, for scanning the output data of the latch circuit to generate a scanning data according to the driving clock; wherein when the driving clock has a transition from a first logical level to a second logical level, the control circuit allows the latch circuit to latch the input data for determining the output data, and the scanning circuit scans the output data to generate the scanning data; and when the driving clock has a transition from the second logical level to the first logical level, the control circuit does not allow the latch circuit to latch the input data for determining the output data, and the scanning circuit holds the scanning data.

According to an embodiment of the present invention, a scanning register circuit is disclosed. The scanning register circuit comprises a plurality of cascaded register circuits, each register circuit comprises: a latch circuit, an input signal selecting circuit, a control circuit, and a scanning circuit. The latch circuit is utilized for latching an input data to generate an output data; the input signal selecting circuit is coupled to a non-test data and a test data respectively, for selectively outputting the non-test data or the test data as the input data; the control circuit is coupled to a driving clock, for controlling the latch circuit to selectively latch the input data for determining the output data according to the driving clock; and the scanning circuit is coupled to the driving clock and the latch circuit, for scanning the output data outputted from the latch circuit to generate a scanning data according to the driving clock, where when the driving clock has a transition from a first logical level to a second logical level, the control circuit allows the latch circuit to latch the input data for determining the output data, and the scanning circuit scans the output data to generate the scanning data; and when the driving clock has a transition from the second logical level to the first logical level, the control circuit does not allow the latch circuit to latch the input data for determining the output data, and the scanning circuit holds the scanning data; wherein except for a leading register circuit, the scanning circuit of each register circuit is coupled to the input signal selecting circuit of a next register circuit, for inputting the generated scanning data to the next register circuit as the test data of the next register circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
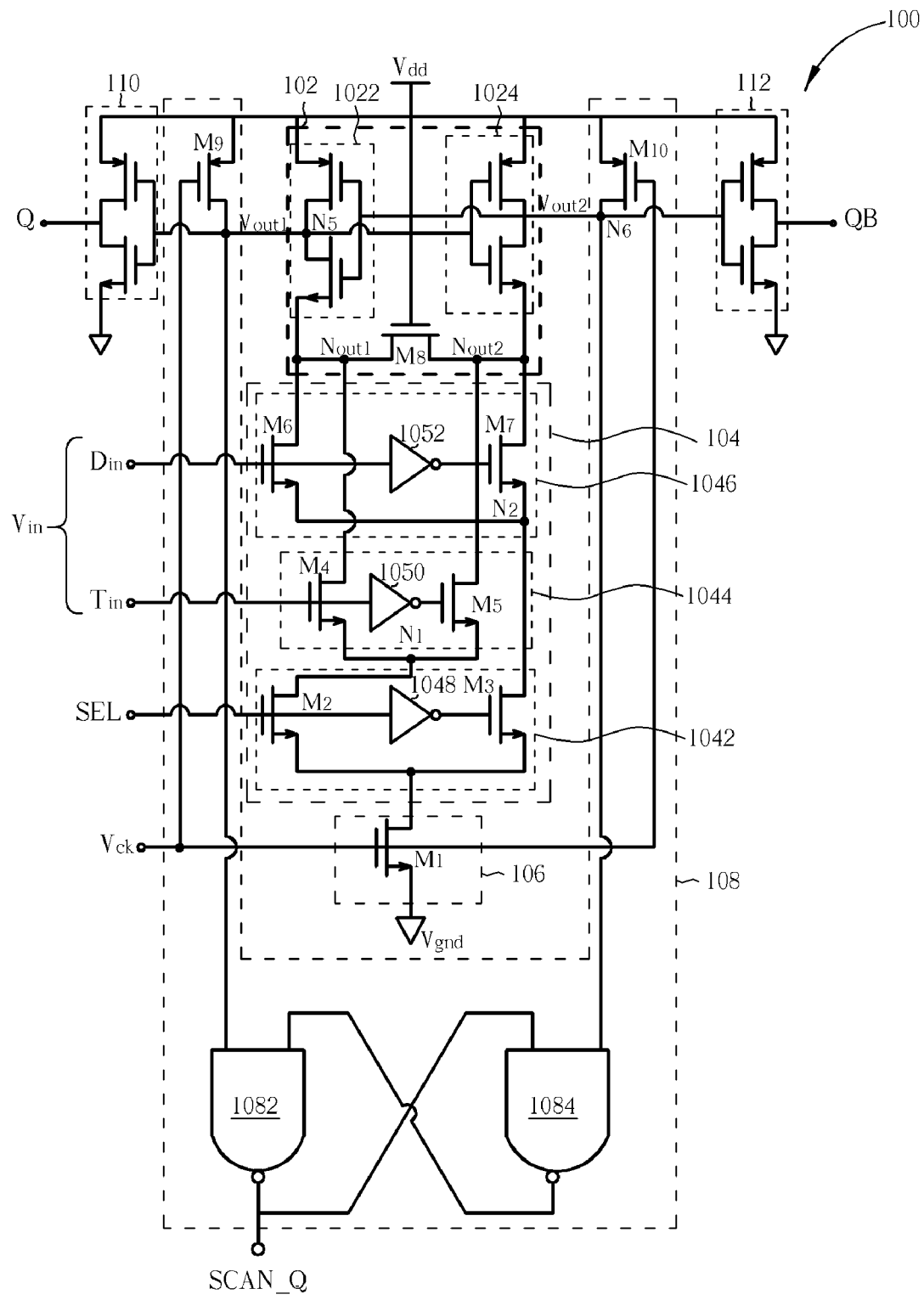
FIG. 1 is a diagram illustrating a register circuit according to an embodiment of the present invention.

Please refer to FIG. 1. FIG. 1 is a diagram illustrating a register circuit 100 according to an embodiment of the present invention. The register circuit 100 comprises: a latch circuit 102, an input signal selecting circuit 104, a control circuit 106, and a scanning circuit 108. The latch circuit 102 is utilized for latching an input data $V_{in}$ to generate an output data Q (please note that another output data QB is the complementary signal of the output data Q). The input signal selecting circuit 104 is coupled to a non-test data $D_{in}$ and a test data $T_{in}$ for selectively outputting the non-test data $D_{in}$ or the test data $T_{in}$ as the input data $V_{in}$ that is processed by the register circuit 100. The control circuit 106 is coupled to a driving clock $V_{ck}$, for controlling the latch 102 to latch the input data $V_{in}$ for determining the output data Q according to the driving clock $V_{ck}$. The scanning circuit 108 is coupled to the driving clock $V_{ck}$ and the latch circuit 102, for scanning the output data Q generated from the latch circuit 102 to generate a scanning data SCAN_Q according to the driving clock $V_{ck}$. In the present embodiment, when the driving clock $V_{ck}$ has a transition from a low logical level $V_{low}$ to a high logical level $V_{high}$, the control circuit 106 allows the latch circuit 102 to latch the input data $V_{in}$ for determining the output data Q, and the scanning circuit 108 scans the output data Q to generate the scanning data SCAN_Q; however, when the driving clock $V_{ck}$ has a transition from the high logical level $V_{high}$ to the low logical level $V_{low}$, the control circuit 106 does not allow the latch circuit 102 to latch the input data $V_{in}$ to determine the output data Q, and the scanning circuit 108 holds the scanning data SCAN_Q.

In FIG. 1, the control circuit 106 is implemented by an N-type MOS transistor $M_1$, the N-type MOS transistor $M_1$ being coupled between the input signal selecting circuit 104 and a first predetermined voltage level $V_{gnd}$, for selectively coupling the first predetermined voltage level $V_{gnd}$ to the input signal selecting circuit 104 and according to the driving clock $V_{ck}$. The latch circuit 102 determines the output data Q according to the input data $V_{in}$ (non-test data $D_{in}$ and test data $T_{in}$) received at a first data output terminal $N_{out1}$ and a second data output terminal $N_{out2}$ of the input signal selecting circuit 104. In this embodiment, the input signal selecting circuit 104 comprises a first switch 1042, a second switch 1044, and a third switch 1046. The first switch 1042 comprises an N-type MOS transistor $M_2$, an N-type MOS transistor $M_3$, and an inverter 1048, thus the first switch 1042 selectively couples the control circuit 106 to a first output terminal $N_1$ or a second output terminal $N_2$ according to a selecting signal SEL; the second switch 1044 comprises an N-type MOS transistor $M_4$, an N-type MOS transistor $M_5$, and an inverter 1050, for selectively coupling the first output terminal $N_1$ to the first data output terminal $N_{out1}$ or the second data output terminal $N_{out2}$ according to the non-test data $D_{in}$; the third switch 1046 comprises an N-type MOS transistor $M_6$, an N-type MOS transistor $M_7$, and an inverter 1052, for selectively coupling the second output terminal $N_2$ to the first data output terminal $N_{out1}$ or the second data output terminal $N_{out2}$ according to the test data $T_{in}$.

Furthermore, the latch circuit 102 comprises a first inverter 1022, a second inverter 1024, and a transistor $M_8$, wherein the first inverter 1022 determines the output data $V_{out1}$ at the output terminal $N_5$ according to a second predetermined voltage level $V_{dd}$ or the input data $V_{in}$ received at the first data output terminal $N_{out1}$; the second inverter 1024 determines the output data $V_{out2}$ at the output terminal $N_6$ according to the second predetermined voltage level $V_{dd}$ or the input data $V_{in}$ received at the second data output terminal $N_{out2}$; and the control terminal $G_1$ of the transistor $M_8$ is coupled to the second predetermined voltage level $V_{dd}$, and both terminals of the transistor $M_8$ are coupled to the first and the second data output terminal $N_{out1}$ and $N_{out2}$ respectively. In FIG. 1, the output terminal of the first inverter 1022 is coupled to the input terminal of the second inverter 1024, and the output terminal of the second inverter 1024 is coupled to the input terminal of the first inverter 1022.

In this embodiment, the scanning circuit 108 comprises a P-type MOS transistor $M_9$, a P-type MOS transistor $M_{10}$, and a plurality of NAND gates 1082, 1084. The P-type MOS transistor $M_9$ selectively inputs the second predetermined voltage level $V_{dd}$ to an input terminal $N_3$ of the NAND gate 1082 according to the driving clock $V_{ck}$; the P-type MOS transistor $M_{10}$ selectively inputs the second predetermined voltage level $V_{dd}$ to an input terminal $N_4$ of the NAND gate 1084 according to the driving clock $V_{ck}$; and the output terminal of the NAND gate 1082 outputs the scanning data SCAN_Q. Please note that the output of the NAND gate 1084 and the output of the NAND gate 1082 are complementary, thus a circuit designer can obtain the output data Q from the complementary signal of SCAN_Q at the output terminal of the NAND gate 1084. On the other hand, in FIG. 1, the register circuit 100 of the present invention further comprises two voltage level adjusting circuits that are coupled to the latch circuit 102, in which the voltage level adjusting circuit is comprised of two inverters 110, 112, for transferring the output data $V_{out1}$ generated at the output terminal $N_5$ and outputting the output data $V_{out2}$ generated at the output terminal $N_6$ into the output data Q and output data QB, respectively.

Figure 2:
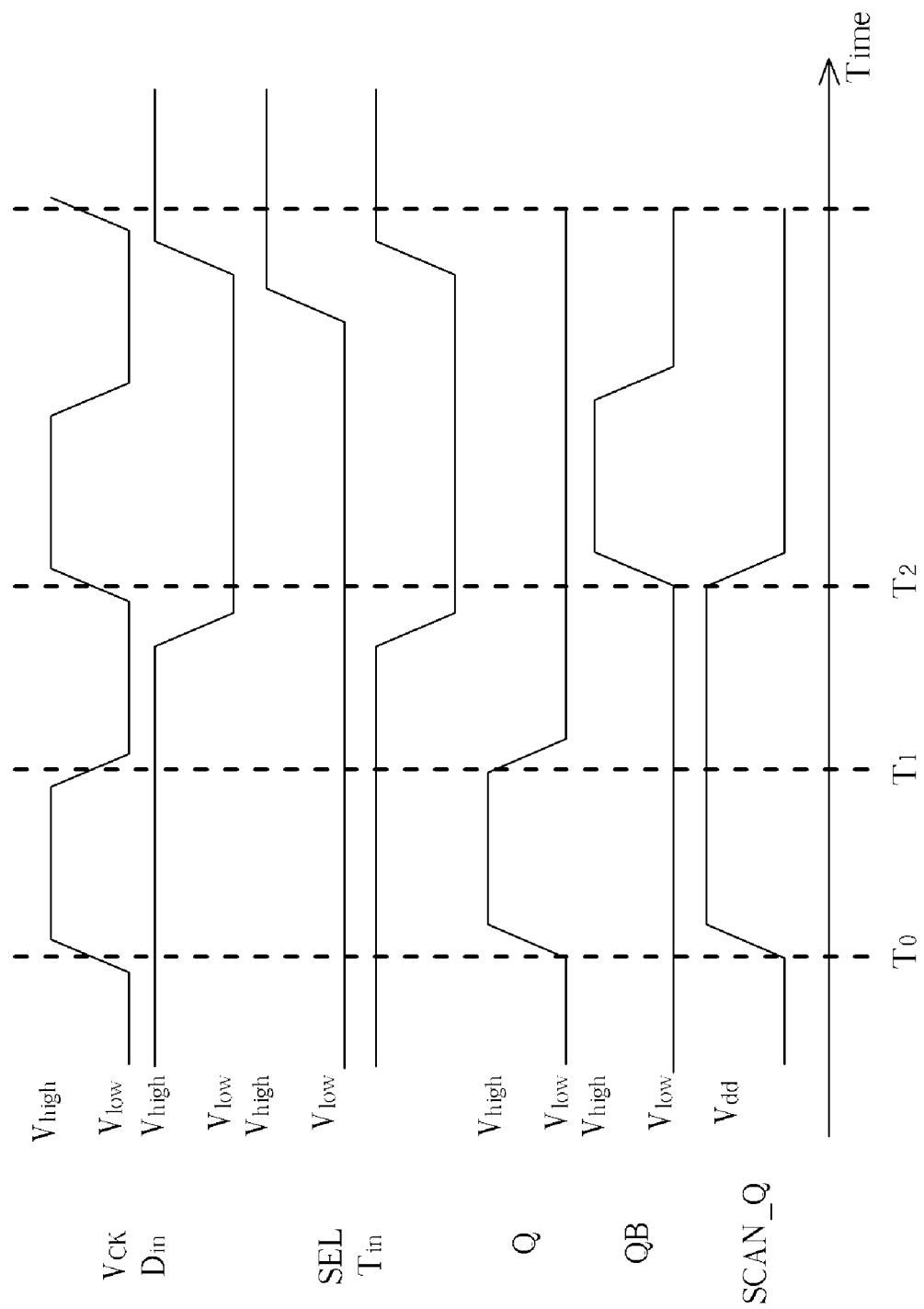
FIG. 2 is an operation timing diagram according to the register circuit of FIG. 1.

Please refer to FIG. 2. FIG. 2 is an operation timing diagram according to the register circuit 100 of FIG. 1. For brevity, the initial time of the register circuit 100 is started at $T_0$ in FIG. 2. When the driving clock $V_{ck}$ is switched from $V_{low}$ to $V_{high}$, the N-type MOS $M_1$ is conducted; where at $T_0$ the selecting signal SEL is at low voltage level $V_{low}$, thus it can be known that the register circuit 100 is currently operating in a non-test mode, in other words, the input data $V_{in}$ that is processed by the register circuit 100 is the non-test data $D_{in}$. For brevity, assume that the test data $T_{in}$ is the same as the non-test data $D_{in}$. Meanwhile, the N-type MOS transistor $M_3$ in the first switch 1042 is turned on, and the N-type MOS transistor $M_2$ is turned off to consequently conduct the path comprised of the N-type MOS transistors $M_1$, $M_3$, the third switch 1046 and the latch circuit 102. At time $T_0$, the non-test data $D_{in}$ is at a high voltage level $V_{high}$ that will consequently turn on the N-type MOS transistor $M_6$ and turn off the N-type MOS transistor $M_7$. Accordingly, a first discharging current $I_1$ will flow from the first data output terminal $N_{out1}$ to the ground terminal $V_{gnd}$ to proceed the discharging, forcing the voltage at the output terminal $N_5$ of the first inverter 1022 of the latch circuit 102 to decrease. Furthermore, when the driving clock $V_{ck}$ is $V_{high}$, the P-type MOS transistors $M_9$, $M_{10}$ of the scanning circuit 108 are turned off, thereby increasing the discharging speed of the voltage at the output terminal $N_5$. Because the output terminal of the first inverter 1022 is coupled to the input terminal of the second inverter 1024, and the output terminal $N_6$ of the second inverter 1024 is coupled to the input terminal of the first inverter 1022, the voltage at the output terminal $N_5$ will be discharged to 0V. Therefore, the output data Q of the inverter 110 of the register circuit 100 of the present invention is $V_{dd}$. On the other hand, the voltage of the output terminal $N_6$ will be locked at a high voltage level. Similarly, the output data QB of the inverter 112 of the register circuit 100 of the present invention is 0V. Meanwhile, the NAND gates 1082 and 1084 of the scanning circuit 108 are coupled to the low voltage level of the output terminal $N_5$ and the high voltage level of the output terminal $N_6$ respectively, to consequently equalize the voltage level of the scanning data SCAN_Q and the output data Q. Because the configuration of the NAND gates 1082 and 1084 are prior art, the operation of obtaining the scanning data SCAN_Q is omitted here for brevity.

Then, at time $T_1$, the driving clock $V_{ck}$ is switched from $V_{high}$ to $V_{low}$, thus the N-type MOS transistor $M_1$ will turn off, and consequently open the current path comprised of the N-type MOS transistors $M_1$, $M_2$, the third switch 1046, and the latch circuit 102; meanwhile, the P-type MOS transistors $M_9$, $M_{10}$ of the scanning circuit 108 will be turned on to start charging the output terminals $N_5$ and $N_6$. Accordingly, both the output voltages $V_{out1}$ and $V_{out2}$ of the output terminals $N_5$ and $N_6$ are at a high voltage level, which is $V_{dd}$. The NAND gates 1082 and 1084 of the scanning circuit 108 are coupled to the high voltage level of the output terminal $N_5$ and the high voltage level of the output terminal $N_6$ respectively, to hold the output scanning data SCAN_Q at the input voltage level of $T_0$ and $T_1$, as shown in the time space $T_1$ and $T_2$ of FIG. 2. Meanwhile, because both the output voltages $V_{out1}$ and $V_{out2}$ of the output terminals $N_5$ and $N_6$ are at a high voltage level, the output data Q and output data QB will be forced to be 0V. When the non-test data $D_{in}$ is switched from $V_{high}$ to $V_{low}$, the following operation is the same as the above-mentioned disclosure, thus a detailed description is omitted.

Figure 3:
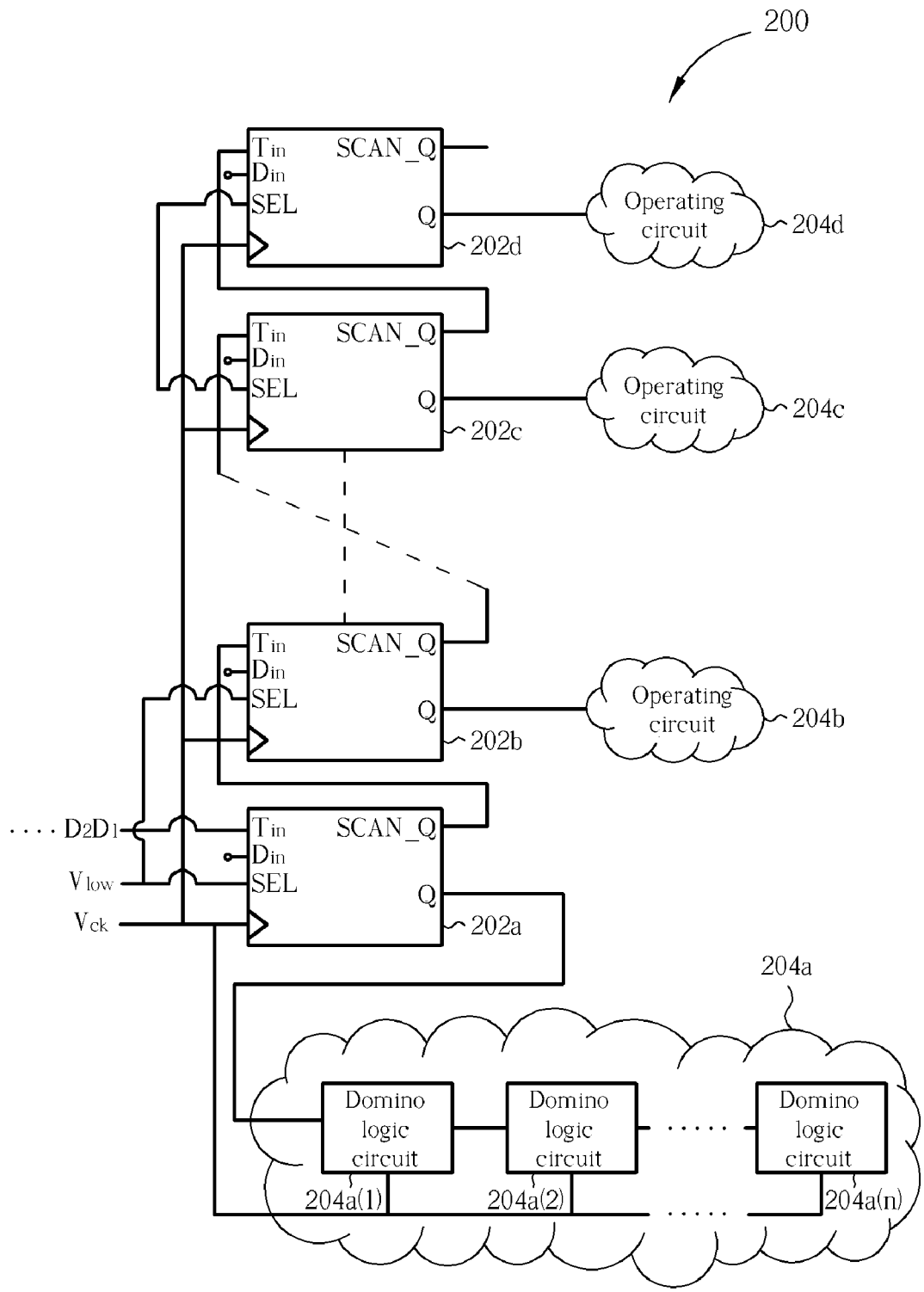
FIG. 3 is a diagram illustrating a scanning register circuit according to an embodiment of the present invention.

Please refer to FIG. 3. FIG. 3 is a diagram illustrating a scanning register circuit 200 according to an embodiment of the present invention. The scanning register circuit 200 comprises a plurality of register circuits that are connected in series with each other. Please note that, without affecting the spirit of the present invention, there are only four register circuits 202a, 202b, 202c, 202d shown in FIG. 3, wherein the configuration and operation of each of the register circuits 202a, 202b, 202c, 202d are the same as the register circuit 100 in FIG. 1. In other words, each of the register circuits 202a, 202b, 202c, 202d comprises the latch circuit 102, the input signal selecting circuit 104, the control circuit 106 and the scanning circuit 108 as shown in FIG. 1. Please note that, except for the leading register circuit 202a, the scanning circuit of each register circuit is coupled to the input signal selecting circuit of the next register circuit for inputting the generated scanning data SCAN_Q to the next register circuit to become the test data Tin. Because the configuration and the operation of each of the register circuits 202a, 202b, 202c, and 202d have been disclosed in FIG. 1, a detailed description is omitted here. In other words, the control circuit of each of the register circuits 202a, 202b, 202c, 202d are coupled to a common driving clock $V_{ck}$, therefore only one driving clock $V_{ck}$ is utilized to control the scanning register circuit 200 of the present invention. When the scanning register circuit 200 of the present invention operates in normal mode, the selecting signal SEL of the first switch, such as the first switch 1042 of FIG. 1, of each of the register circuits 202a, 202b, 202c, 202d will be at the low voltage level, and the input data $V_{in}$ is the non-test data $D_{in}$. Furthermore, the output data Q of the latch circuit, such as the latch circuit 102 of FIG. 1, of each of the register circuits 202a, 202b, 202c, 202d will transfer to the specific operating circuits 204a, 204b, 204c, 204d, respectively, for further processing. For example, the operating circuits 204a, 204b, 204c, and 204d can be the Domino CMOS Logic circuits. Please refer to the operating circuit 204a of FIG. 3, which is comprised of series connected Domino Logic circuits 204a(1)~204a(n), where the n Domino Logic circuits 204a(1)~204a(n) utilize a common driving clock $V_{ck}$.

Figure 4:
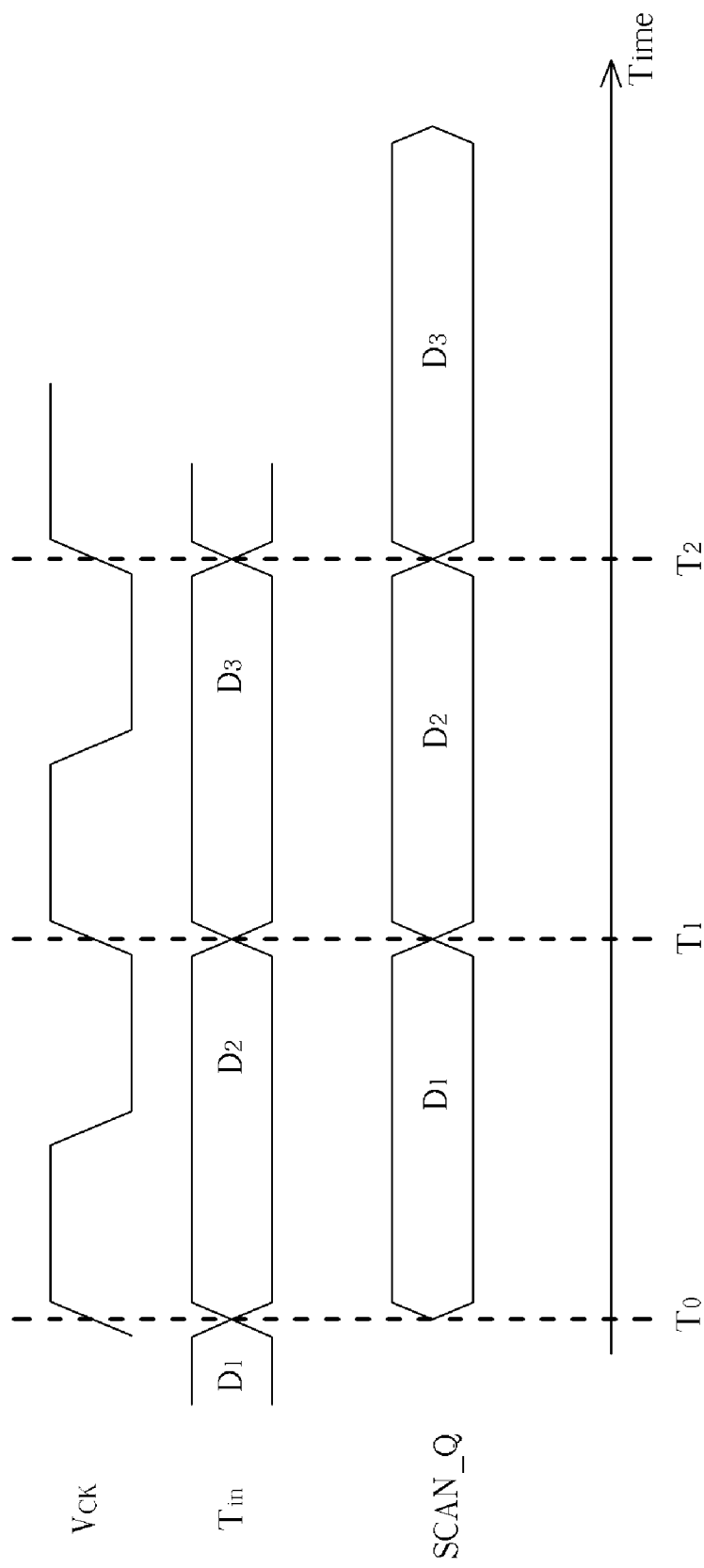
FIG. 4 is an operation timing diagram according to the scanning register circuit of FIG. 3.

When the scanning register circuit 200 is operating in testing mode, the selecting signal SEL of the first switch, such as the first switch 1042 of FIG. 1, of each of the register circuits 202a, 202b, 202c, 202d will be at the high voltage level, and the input data $V_{in}$ will be the test data Tin. Please refer to FIG. 4. FIG. 4 is an operation timing diagram according to the scanning register circuit 200 of FIG. 3. For brevity, the initial time of the scanning register circuit 200 is started at $T_0$ of FIG. 4. At time $T_0$, the driving clock $V_{ck}$ is switching from $V_{low}$ to $V_{high}$, the input data of the test data Tin is $D_1$, thus the data read by the register circuit 202a becomes $D_1$, and the scanning data SCAN_Q becomes $D_1$. At time $T_1$, the driving clock $V_{ck}$ is switched from $V_{low}$ to $V_{high}$, meanwhile the input data of the test data $T_{in}$ is $D_2$, thus the data read by the register circuit 202b becomes $D_2$, and the scanning data SCAN_Q becomes $D_2$. Therefore, the register circuit 202a can just read the scanning data SCAN_Q of the register circuit 202 at time $T_1$, as shown in FIG. 4. Accordingly, a person skilled in the art can easily understand that the scanning register circuit 200 of the present invention can complete a scanning operation by utilizing only one driving clock $V_{ck}$. Compared to the prior art, there is no phase locking limitation with another driving clock by using only one driving clock $V_{ck}$; furthermore, the clock balance of the driving clock $V_{ck}$ can be adjusted more freely. On the other hand, the scanning register circuit 200 that utilizes the output data Q and the scanning data SCAN_Q to operate in the normal mode and the testing mode, respectively, is more appropriate to be used in a dynamic circuit configuration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A register circuit, comprising:
    a latch circuit, for latching an input data to generate an output data;
    an input signal selecting circuit, coupled to a non-test data and a test data respectively, for selectively outputting the non-test data or the test data as the input data;
    a control circuit, coupled to a driving clock, for controlling the latch circuit to selectively latch the input data for determining the output data according to the driving clock; and
    a scanning circuit, coupled to the driving clock and the latch circuit, for scanning the output data of the latch circuit to generate a scanning data according to the driving clock;
    wherein when the driving clock has a transition from a first logical level to a second logical level, the control circuit allows the latch circuit to latch the input data for determining the output data, and the scanning circuit scans the output data to generate the scanning data; and when the driving clock has a transition from the second logical level to the first logical level, the control circuit does not allow the latch circuit to latch the input data for determining the output data, and the scanning circuit holds the scanning data.

2. The register circuit of claim 1, wherein the control circuit is a switching device, coupled between the input signal selecting circuit and a first predetermined voltage level, for selectively connecting the input signal selecting circuit to the first predetermined voltage level according to the driving clock; the latch circuit generates the output data according to the input data at a first data output terminal and a second data output terminal of the input signal selecting circuit; and the input signal selecting circuit comprises:
    a first switch, coupled to the control circuit, for selectively coupling the control circuit to a first output terminal or a second output terminal according to a selecting signal;
    a second switch, coupled to the first output terminal of the first switch, for selectively coupling the first output terminal to the first data output terminal or the second data output terminal according to the non-test data; and a third switch, coupled to the second output terminal of the first switch, for selectively coupling the second output terminal to the first data output terminal or the second data output terminal according to the test data.

3. The register circuit of claim 2, wherein the latch circuit comprises:
   a first inverter, for generating the output data at an output terminal of the first inverter according to the input data received by the first data output terminal or a second predetermined voltage level;
   a second inverter, for generating the output data at an output terminal of the second inverter according to the input data received by the second data output terminal or the second predetermined voltage level; and
   a transistor, having a control terminal coupled to the second predetermined voltage level, and two terminals coupled to the first and second data output terminals, respectively;
   wherein the output terminal of the first inverter is coupled to an input terminal of the second inverter, the output terminal of the second inverter is coupled to an input terminal of the first inverter, and the output terminal of the first inverter or the output terminal of the second inverter is utilized for outputting the output data.

4. The register circuit of claim 3, wherein the scanning circuit comprises a first switching device, a second switching device, a first logic gate, and a second logic gate; the first switching device selectively couples the second predetermined voltage level to an input terminal of the first logic gate according to the driving clock; the second switching device selectively couples the second predetermined voltage level to an input terminal of the second logic gate according to the driving clock; an output terminal of the first logic gate is coupled to another input terminal of the second logic gate; the output terminal of the second logic gate is coupled to another input terminal of the first logic gate; and the output terminal of the first logic gate or the output terminal of the second logic gate is utilized to output the scanning data.

5. The register circuit of claim 3, further comprising:
   at least a level adjusting circuit, coupled to the latch circuit, for adjusting a voltage level of the output data.

6. The register circuit of claim 5, wherein the level adjusting circuit is an inverter, for adjusting the output data according to the first predetermined voltage level or the second predetermined voltage level.

7. The register circuit of claim 1, being driven by the driving clock only.

8. A scanning register circuit, comprising:
   a plurality of cascaded register circuits, each comprising:
      a latch circuit, for latching an input data to generate an output data;
      an input signal selecting circuit, coupled to a non-test data and a test data respectively, for selectively outputting the non-test data or the test data as the input data;
      a control circuit, coupled to a driving clock, for controlling the latch circuit to selectively latch the input data for determining the output data according to the driving clock; and
      a scanning circuit, coupled to the driving clock and the latch circuit, for scanning the output data outputted from the latch circuit to generate a scanning data according to the driving clock, where when the driving clock has a transition from a first logical level to a second logical level, the control circuit allows the latch circuit to latch the input data for determining the output data, the scanning circuit scans the output data to generate the scanning data; and when the driving clock has a transition from the second logical level to the first logical level, the control circuit does not allow the latch circuit to latch the input data for determining the output data, and the scanning circuit holds the scanning data;
   wherein except for a leading register circuit, the scanning circuit of each register circuit is coupled to the input signal selecting circuit of a next registering circuit, for inputting the generated scanning data to the next register circuit as the test data of the next register circuit.

9. The scanning register circuit of claim 8, wherein the control circuit is a switching device, coupled between the input signal selecting circuit and a first predetermined voltage level, for selectively connecting the input signal selecting circuit to the first predetermined voltage level according to the driving clock; the latch circuit generates the output data according to the input data at a first data output terminal and a second data output terminal of the input signal selecting circuit; and the input signal selecting circuit comprises:
   a first switch, coupled to the control circuit, for selectively coupling the control circuit to a first output terminal or a second output terminal according to a selecting signal;
   a second switch, coupled to the first output terminal of the first switch, for selectively coupling the first output terminal to the first data output terminal or the second data output terminal according to the non-test data; and
   a third switch, coupled to the second output terminal of the first switch, for selectively coupling the second output terminal to the first data output terminal or the second data output terminal according to the test data.

10. The scanning register circuit of claim 8, wherein the latch circuit comprises:
   a first inverter, for generating the output data at an output terminal of the first inverter according to the input data received by the first data output terminal or a second predetermined voltage level;
   a second inverter, for generating the output data at an output terminal of the second inverter according to the input data received by the second data output terminal or the second predetermined voltage level; and
   a transistor, having a control terminal coupled to the second predetermined voltage level, and two terminals coupled to the first and second data output terminals, respectively;
   wherein the output terminal of the first inverter is coupled to an input terminal of the second inverter, the output terminal of the second inverter is coupled to an input terminal of the first inverter, and the output terminal of the first inverter or the output terminal of the second inverter is utilized for outputting the output data.

11. The scanning register circuit of claim 10, wherein the scanning circuit comprises a first switching device, a second switching device, a first logic gate, and a second logic gate; the first switching device selectively couples the second predetermined voltage level to an input terminal of the first logic gate according to the driving clock; the second switching device selectively couples the second predetermined voltage level to an input terminal of the second logic gate according to the driving clock; an output terminal of the first logic gate is coupled to another input terminal of the second logic gate; an output terminal of the second logic gate is coupled to another input terminal of the first logic gate; and the output terminal of the first logic gate or the output terminal of the first logic gate is utilized to output the scanning data.

12. The scanning register circuit of claim 10, further comprising:
    at least a level adjusting circuit, coupled to the latch circuit, for adjusting a voltage level of the output data.

13. The scanning register circuit of claim 12, wherein the level adjusting circuit is an inverter, for adjusting the output data according to the first predetermined voltage level or the second predetermined voltage level.

14. The scanning register circuit of claim 8, being driven by the driving clock only.

\* \* \* \* \*